United States Patent [19]
Hatagishi et al.

[11] Patent Number: 5,777,480
[45] Date of Patent: Jul. 7, 1998

[54] CONNECTOR CONDUCTION TESTER, AND TERMINAL LOCKING METHOD FOR CONNECTOR CONDUCTION TEST

[75] Inventors: Yuji Hatagishi; Toshihiko Yamamoto; Kimihiro Abe; Toshiaki Okabe, all of Shizuoka, Japan

[73] Assignee: Yazaki Corporation, Tokyo, Japan

[21] Appl. No.: 675,051

[22] Filed: Jul. 3, 1996

[30] Foreign Application Priority Data

Jul. 6, 1995 [JP] Japan ................................ 7-171045

[51] Int. Cl.⁶ ........................................................ G01R 31/04
[52] U.S. Cl. ........................... 324/538; 439/310; 439/488
[58] Field of Search ............................. 324/538, 756, 324/158.1; 439/310, 488, 489

[56] References Cited

U.S. PATENT DOCUMENTS

| | | | |
|---|---|---|---|
| 4,902,968 | 2/1990 | Sugimoto | 324/538 |
| 5,429,519 | 7/1995 | Murakami et al. | 429/310 |
| 5,512,833 | 4/1996 | Fukuda et al. | 324/538 |
| 5,528,821 | 6/1996 | Matsuzawa | 324/538 |
| 5,582,523 | 12/1996 | Noro et al. | 429/310 |
| 5,586,900 | 12/1996 | Yagi et al. | 324/538 |
| 5,614,820 | 3/1997 | Aoyama et al. | 324/538 |

FOREIGN PATENT DOCUMENTS

| | | | |
|---|---|---|---|
| 0354124 | 2/1990 | European Pat. Off. | 324/538 |
| 2690250 | 10/1993 | France | 324/538 |
| 0163371 | 7/1991 | Japan | 324/538 |
| 046082511 | 3/1994 | Japan | 324/538 |

*Primary Examiner*—Maura K. Regan
*Attorney, Agent, or Firm*—Sughrue, Mion, Zinn, Macpeak & Seas, PLLC

[57] ABSTRACT

A connector conduction tester includes a conduction testing section and a connector holding section which are arranged on a stand frame and an operating section for moving the conducting testing section towards the connector holding section, in which a conduction testing operation is carried out with testing pins of the conduction testing section abutted against terminals in a connector. In the tester, the stand frame has a spacer supplying hole which is confronted with a spacer inserting hole formed in a connector set in the connector holding section, and spacer pushing device located below the spacer supplying hole. Furthermore, a conduction testing method in which a connector is set in a connector holding section and a conduction testing section is moved, so that the conduction of terminals in the connector is tested with testing pins, in which a spacer is supplied to a spacer supplying hole in a stand frame which hole is confronted with a spacer inserting hole formed in the connector, and when the connector is engaged with the conduction testing section, the spacer is pushed into the spacer inserting hole from the spacer supplying hole with the aid of pushing device.

4 Claims, 5 Drawing Sheets

CONNECTOR CONDUCTION TESTER, AND TERMINAL LOCKING METHOD FOR CONNECTOR CONDUCTION TEST

BACKGROUND OF THE INVENTION

1. Field of the Invention

This invention relates to a connector conductor tester, and a terminal locking method for connector conduction test.

2. Background

FIG. 4 shows a conventional connector housing 31, and FIG. 5 shows a conventional spacer 37 engageable therewith. The connector housing 31 is of a male type and includes terminal accommodating chambers 33 in which terminals 32 are inserted, flexible locking lances 36 which are engaged with holes 35 formed in terminal base plates 32', a spacer inserting hole 38 into which the spacer 37 is inserted, and a locking arm 39 which is formed on the upper wall 31a of the housing 31 to engage with a connector housing of female type (not shown). The spacer 37 includes temporary locking pieces 40 which are temporarily locked to the connector housing 31, final locking pieces 41 which are finally locked to the connector housing 31, and terminal locking sections 42 for locking the terminals 32.

The terminals 32 are each locked to the connector housing 31 as follows.

First, the spacer 37 is inserted, as a preparatory operation for assembling a wire harness, into the spacer inserting hole 38 of the connector housing 31, so that the temporary locking pieces 40 of the spacer 37 are engaged with the partition walls 44 separating the terminal accommodating chambers 33 from one another in the connector housing 31; that is, the spacer is temporarily locked to the connector housing. Under this condition, the terminals 32 are inserted into the terminal accommodating chambers 33 until the holes 35 of the terminals 32 are engaged with the flexible locking lances 36 (hereinafter referred to as "a primary locking operation", when applicable).

Next, the spacer 37 is pushed until it is completely inserted into the spacer inserting hole 38, so that the final locking pieces 41 of the spacer 37 are engaged with a locking section 43 of the connector housing 31; that is, the spacer is finally locked to the connector housing, and the terminal locking sections 42 are abutted against the protrusions 34 of the terminals, so that the latter are completely locked (hereinafter referred to as "a secondary locking operation", when applicable).

FIG. 6 shows a conventional connector conduction tester 50 (disclosed by Japanese Patent Publication No. Hei. 4-40669).

The tester 50 includes a rectangular stand frame 3, a conduction testing section 2 arranged on the stand frame 3 at the middle, a connector holding section 4 fixedly mounted on the stand frame 3, and an operating section 51 swingably mounted on the stand frame 3. The connector holding section 4 is located in front of the conduction testing section 2, and the operating section 51 is located at the rear of the conduction testing section 2.

The conduction testing section 2 includes, an engaging recess 52 formed therein on the side of the connector holding section 4 so as to engage with a connector 60, and a plurality of testing pins 19 embedded in the engaging recess 51. The connector holding section 4 includes a front holding board 4", a pair of positioning frames 4' which are extended backwardly from the right and left ends of the front holding board 4' in such a manner that they confront with each other, and an opening 61 in which the wires 16 of the connector 60 are loosely inserted.

The operating section 51 includes an operating lever 21 on which a force acts, a supporting bar 53 which supports the operating lever 21 and which is swingably mounted on the stand frame 3, a pair of links 54 and 54 provided respectively on both sides of the middle of the supporting bar 53, and an operating shaft 56 which is held between the links 54 and 54, and is secured through a guide 55 to the rear end of the conduction testing section 2.

The swing motion of the operating lever 21 is converted into the horizontal motion of the conducting testing section 2 with the aid of the links 54.

A terminal conduction testing operation is carried out as follows. The wires 16 of the connector 60 are loosely guided into the opening 61 of the connector holding section, so that the wires 16 are connected through a circuit (not shown) to wires 17 which have been connected to the testing pins 19, respectively. Under this condition, the terminal conduction testing operation is carried out.

However, the above-described conventional art suffers from the following problems. That is, it is necessary for the operator to temporarily lock the spacer to the connector housing. Hence, the wire harness assembling work is high in cost. In locking the spacer to the connector housing, it is required to apply a great pressing force to the spacer, however, to do so is a great burden to the operator, because he uses his fingers for the spacer locking operation.

SUMMARY OF THE INVENTION

In view of the foregoing, an object of the invention is to provide a connector conduction tester, and a terminal locking method for terminal conduction test which are so designed that the wire harness assembling cost is not increased, and in the operation of locking the spacer to the connector a burden to the operator is lessened.

The foregoing object and other objects of the invention have been achieved by the provision of the following devices:

The first device is a connector conduction tester including a conduction testing section and a connector holding section which are arranged on a stand frame, and an operating section for moving the conducting testing section towards the connector holding section, in which a conduction testing operation is carried out with testing pins of the conduction testing section abutted against terminals in a connector, in which, according to the invention, the stand frame has a spacer supplying hole which is confronted with a spacer inserting hole formed in a connector set in the connector holding section, and spacer pushing device located below the spacer supplying hole.

The second device is a conduction testing method in which a connector is set in a connector holding section, and a conduction testing section is moved, so that the conduction of terminals in the connector is tested with testing pins, in which, according to the invention, a spacer is supplied to a spacer supplying hole in a stand frame which is confronted with a spacer inserting hole formed in the connector, and when the connector is engaged with the conduction testing section, the spacer is pushed into the spacer inserting hole from the spacer supplying hole with the aid of pushing device.

With the tester of the invention, the spacer is smoothly inserted into the spacer inserting hole, which is confronted with the spacer supplying hole, without contacting the outer walls of the connector. In addition, with the aid of the pushing device located below the spacer supplying hole, the spacer is moved upwardly in the spacer supplying hole, so that it is straightly moved from the spacer supplying hole into the spacer inserting hole. That is, the spacer is smoothly and positively moved into the spacer inserting hole.

DETAILED DESCRIPTION OF THE PREFERRED EMBODIMENTS

Figure 1:
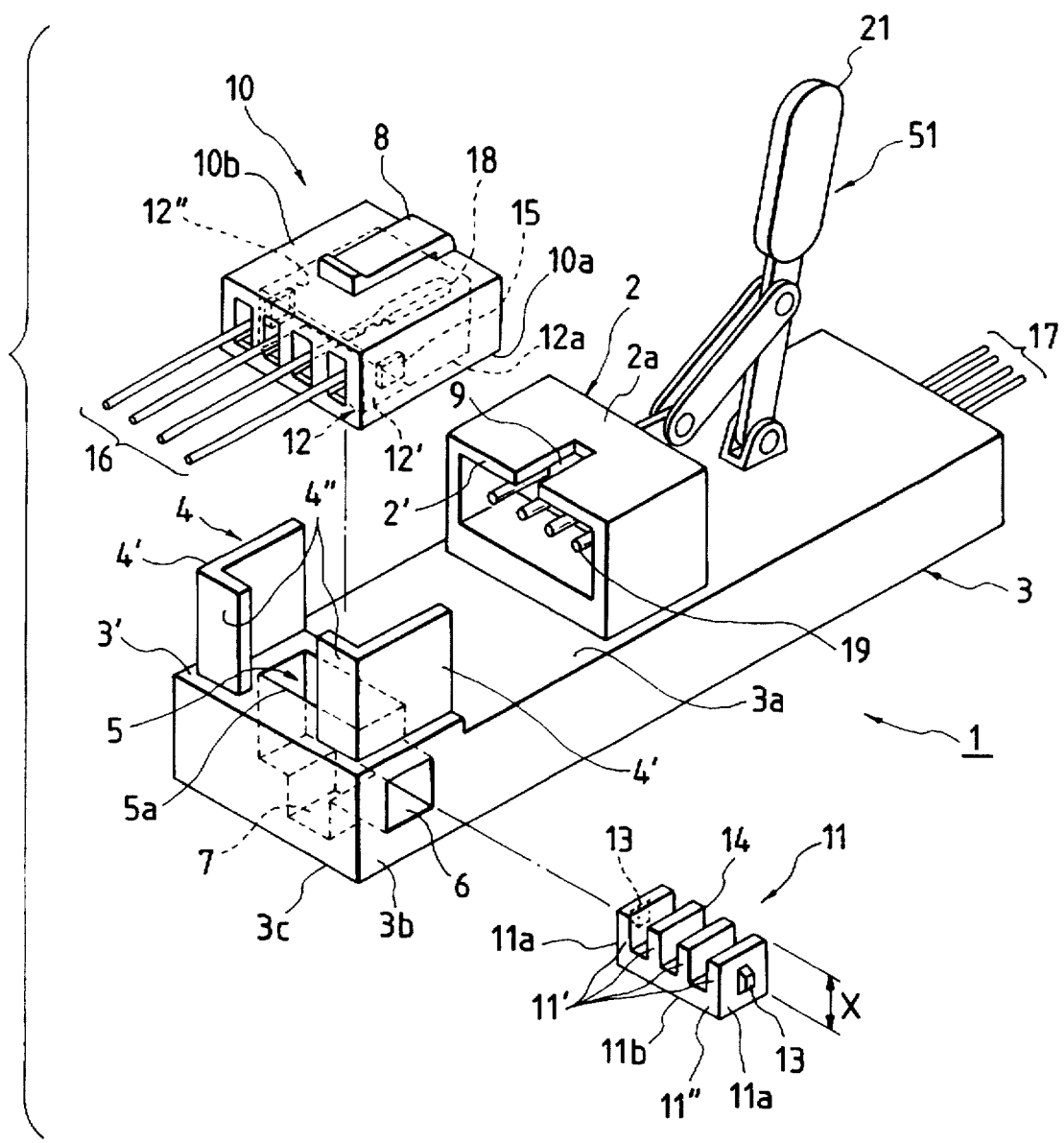
FIG. 1 is a perspective view showing a connector conduction tester according to a preferred embodiment of the invention.
Figure 2:
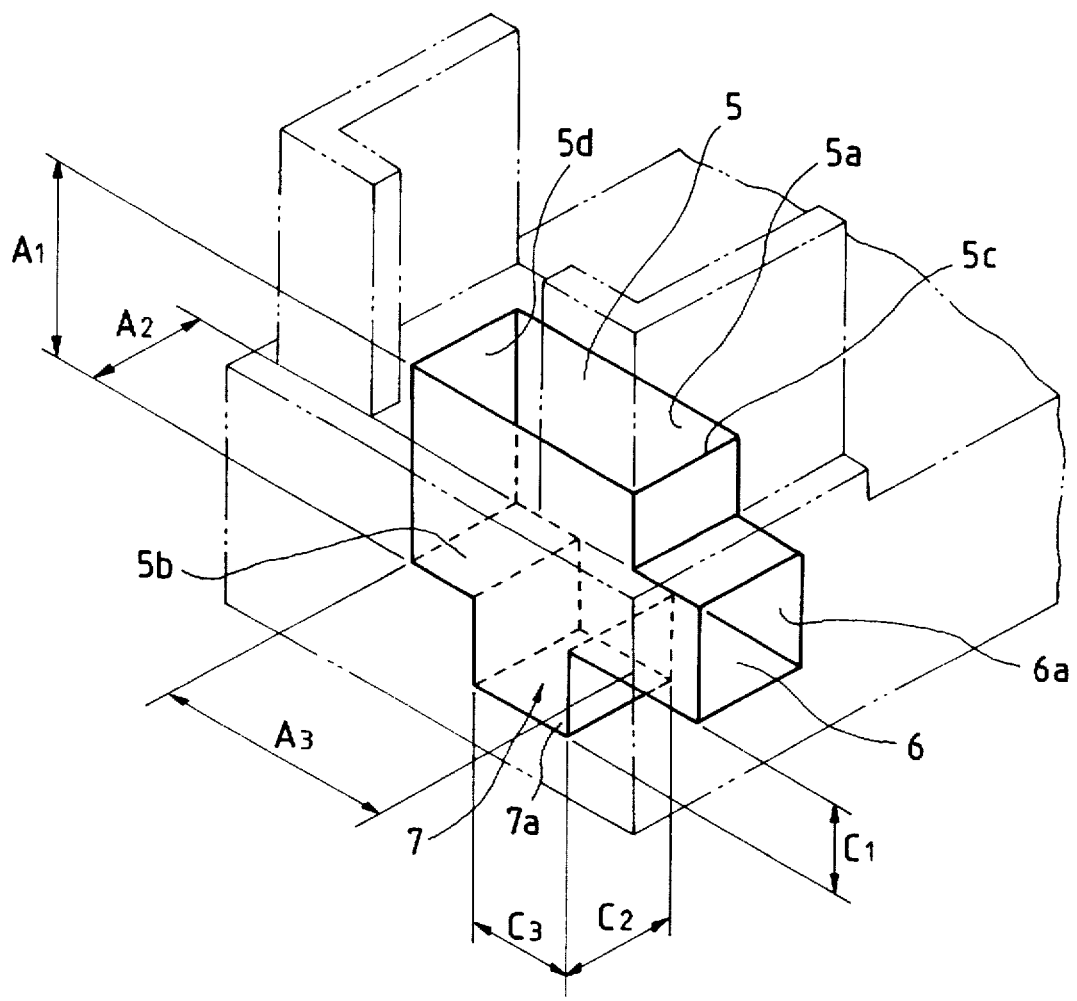
FIG. 2 is an enlarged perspective view showing a spacer supplying hole, a spacer lead-in hole, and a pushing-member inserting hole in the connector conduction tester.
Figure 3:
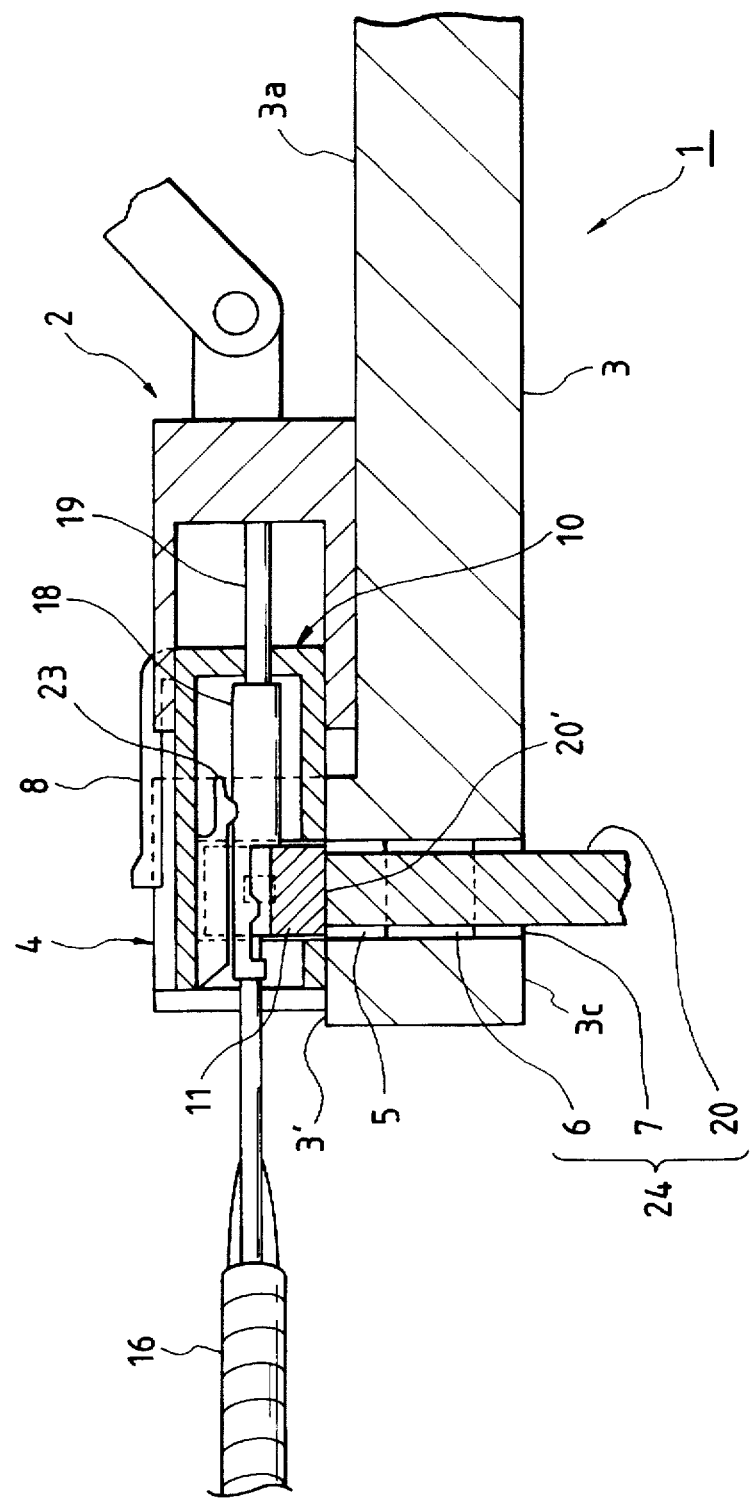
FIG. 3 is a sectional view showing part of the connector conduction tester.
Figure 4:
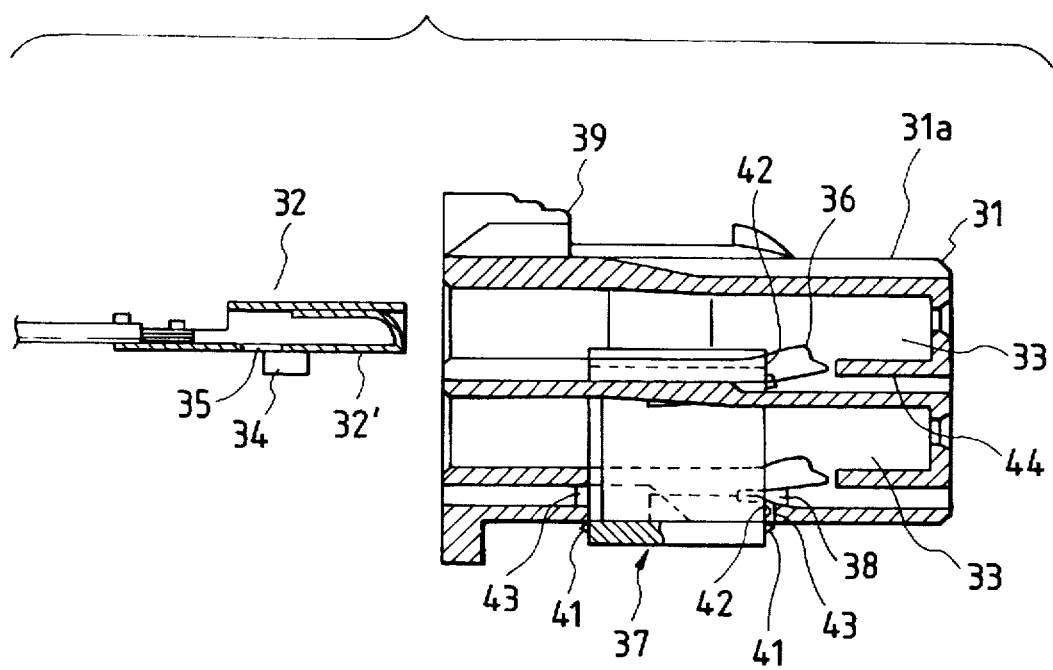
FIG. 4 is a longitudinal sectional view showing a conventional connector housing and a terminal.
Figure 5:
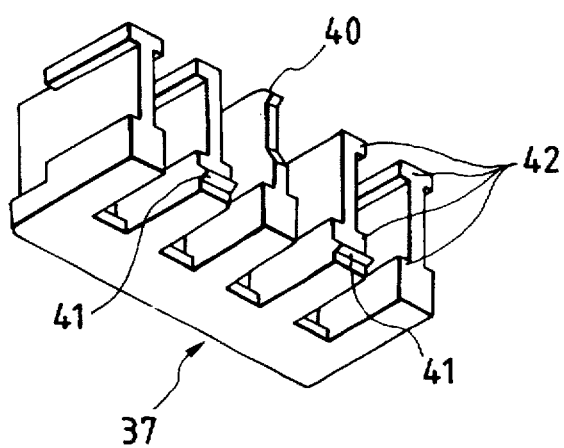
FIG. 5 is a conventional spacer.

An embodiment of a connector conduction tester of the invention will be described with reference to FIGS. 1 to 3.

Figure 6:
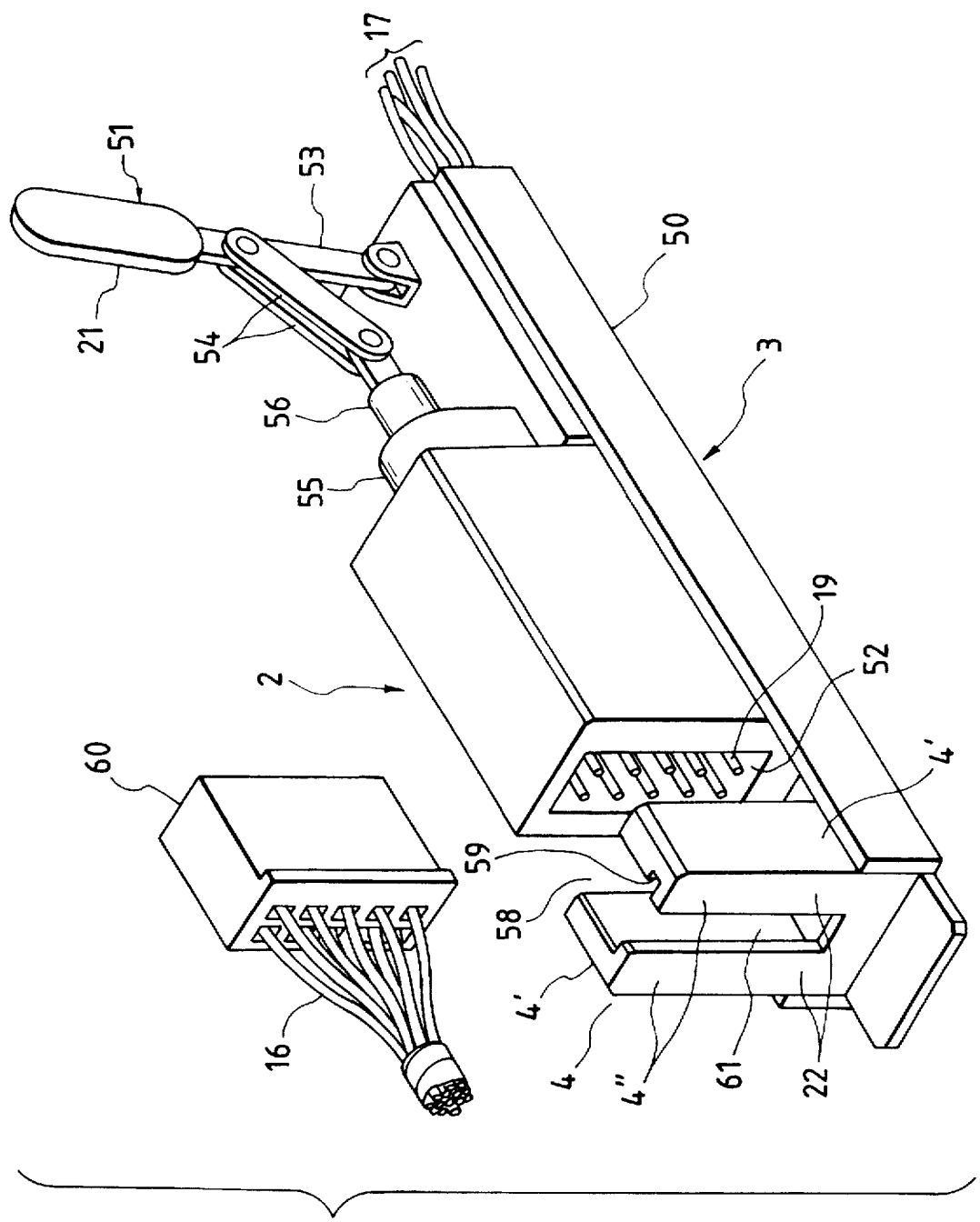
FIG. 6 is a perspective view of a conventional connector conduction tester.

The connector conduction tester 1 according to the invention is different from the above-described conventional one 50 (FIG. 6) in that the former 1 has a spacer supplying hole 5 formed in a hill-like portion 3' (hereinafter referred to as "a hill portion 3'", when applicable) which is raised from the main upper surface 3a of a stand frame 3 on which a conduction testing section 2 is provided, a pushing device 24 located below the spacer supplying hole 5, and a slot 9 which is formed in the upper wall of the conducting testing section 2 so as to engage with the locking arm 8 of a connector 10.

The spacer supplying hole 5 has a supply opening 5a which is positioned as follows: When an outer wall 10a of the connector 10 having a spacer inserting hole 12 is downwardly set (i.e., when the connector 10 is inserted in a connector holding section 4), the supply opening 5a is directly below the spacer inserting hole 12. Further, the spacer supplying hole 5 extended vertically downwardly from the supply opening 5a.

The size of the supply opening 5a of the spacer supplying hole is slightly larger than the horizontal section of a spacer 11 which has a series of comb-teeth-like protrusions 11'. The depth (A1) of the spacer supplying hole is equal to or larger than the vertical length (X) of the spacer 11 (A1≧X). The spacer supplying hole 5 has a flat bottom 5b; however, it is not always necessary that the bottom 5b is flat. On the other hand, the spacer 11 has a pair of locking protrusions 13 (described later). Hence, guides or the like for receiving the locking protrusions 13 may be formed in the right and left inner surface 5c and 5d.

The pushing device 24 includes a spacer lead-in hole 6 which is formed in the right side wall 3b of the stand frame 3 and is communicated with the right inner surface 5c of the spacer supplying hole 5, a pushing-member inserting hole 7 which is located below the spacer supplying hole 5 and into which a pushing member 20 is inserted, the aforementioned pushing member 20 which is moved up and down between the pushing-member inserting hole 7 and the spacer supplying hole 5, and a drive section (not shown) for moving the pushing member up and down.

The lead-in opening 6a of the spacer lead-in hole 6 is in the right side wall 3b of the stand frame 3. The size of the lead-in opening is substantially equal to the vertical section of the spacer 11 in condition in which a manner that its comb-teeth-like protrusions 11' are extended upwardly. The spacer lead-in hole 6 formed in the stand frame 3 is extended from the lead-in opening 6a to the right inner surface 5c of the spacer supplying hole 5. That is, the spacer supply 5 is communicated with the spacer lead-in hole 6 so that the spacer 11 may be moved from the spacer lead-in hole 6 to the spacer supplying hole 5.

Hence, the spacer 11 is moved into the spacer supplying hole 5 through the spacer lead-in hole 6; that is, it is supplied into the spacer supplying hole 5. The spacer lead-in hole 6 may be formed in the stand frame 3 at any point as long as the spacer 11 can be supplied through it and into the spacer supplying hole 5. Hence, the spacer supplying hole 5 may be so designed that it functions also as the spacer lead-in hole 6.

The pushing-member inserting hole has an insertion opening 7a in the bottom wall 3c of the stand frame 3, and is located directly below the bottom 5b of the spacer supplying hole 5. The size of the insertion opening 7a is slightly larger than the horizontal section of the pushing member 20 (described later). The pushing-member inserting hole 7 is communicated with the spacer supplying hole 5.

The longitudinal dimension (C2) of the insertion opening 7a is equal to the longitudinal dimension (A2) of the bottom 5b of the spacer supplying hole 5 (A2=C2). The lateral dimension (C3) is smaller than the lateral dimension (A3) of the bottom 5b of the spacer supplying hole 5 (C3<A3).

The slot 9 is formed in the upper wall 2a of the conduction testing section 2 such that, the slot 9 is extended perpendicular to the front edge 2' of the conduction testing section 2. The width of the slot 9 is slightly larger than the width of the locking arm 8 of the connector 10.

The spacer 11 has the above-described series of comb-teeth-like protrusions 11' which are extended from a coupling plate 11" on one side of the spacer 10, and the above-described locking protrusions 13 formed on both ends 11a and 11a of the spacer 10 which are engaged with a connector housing (or the connector 10 before terminals 18 are inserted thereinto); and the terminal locking ends 14 of the protrusions 11' extended on one side of the spacer 10 for the purpose of securing the terminals 18.

The connector housing of male type has the locking arm 8 provided for mating with a connector of female type (not shown), the spacer inserting hole 12 formed in the outer wall 10a which is opposite to the upper wall 10b on which the locking arm 8 is mounted, and engaging sections 15 formed in the inner surfaces 12a of the spacer inserting hole 12 so that they are engaged with the locking protrusions 13.

The sectional area of the pushing member 20 is slightly smaller than that of the pushing-member inserting hole 7. The length of the pushing member 20 is equal to the sum of the depth (C1) of the pushing-member inserting hole 7 and the depth (A1) of the spacer supplying hole 5 (that is, the length of the member 20=A1+C1). The sectional configuration of the pushing member 20 may be rectangular or circular. The pushing member 20 is freely moved up and down between the pushing-member inserting hole and the spacer supply hole by a drive section (such as for instance an air cylinder).

When inserted in the connector holding section 4, the connector 10 is fixedly held by the positioning frames 4' of the latter 4 and the conduction testing section 2, and the spacer inserting hole 12 of the connector 10 is aligned with the spacer supplying hole 5. The tip end 2' of the pushing member 20 abuts against the bottom 11b of the spacer 11 from just below which is supplied to the spacer supplying hole 5.

As the pushing member 20 is moved upwardly, the spacer 11 is forced upwardly towards the spacer inserting hole 12, finally being set in the spacer inserting hole 12. Thereafter, the pushing member 20 is moved downwardly from the opening 12' of the spacer inserting hole 12 (that is, the supply opening 5a of the spacer supplying hole 5), thus being stopped at the position which is equal in level to the bottom 5b of the spacer supplying hole 5, or slightly below that position.

In order to allow the spacer 11 to smoothly enter the spacer inserting hole 12 which has moved upwardly in the spacer supplying hole 5, the end 20' of the pushing member 20 is positioned at the center of the bottom 11b of the spacer 11. When the end 20' of the pushing member 20 strikes against the center of the bottom 11b of the spacer 11, the latter 11 is pushed into the spacer inserting hole 12 while being kept balanced. Hence, the spacer 11 can be positively set in the spacer inserting hole 12. In the above-described embodiment, only one pushing member 20 is employed, however, more than one pushing member may be used.

Now, a terminal locking method for connector conduction test will be described.

First, terminals 18 are inserted into the connector housing (not shown), and then locked with flexible locking lances 23 (primary locking). The connector 10 in the primary locking state is set in the connector holding section 4 of the connector conduction tester 1 with the upper wall 10b of the connector 10 oriented upwardly which has the locking arm 8 (or with the outer wall 10a having the spacer inserting hole 13 set at the bottom). With the comb-teeth-shaped protrusions 11' oriented upwardly, the spacer 11 is inserted into the spacer supplying hole through the spacer lead-in hole 6 until the spacer 11 is positioned on the bottom 5b of the spacer supplying hole 5.

Next, the operating lever 21 is swung to move the conduction testing section 1 forwardly until the locking arm 8 of the connector 10 is loosely inserted into the slot 9 of the conduction testing section 2 while the terminals 18 are brought into contact with the testing pins 19. As a result, the wires 17 connected to the testing pins 19 are connected through a testing circuit (not shown) to the wires 16 extended from the connector 10, so that the conduction testing operation of the terminals is carried out while it is detected whether or not any one of the terminals comes off the connector.

In the case where any one of the terminals comes off the connector, then the connector is removed from the connector holding section 4, and that terminal is pushed into the connector 10 until it is locked by the flexible locking lance 23. Under this condition, the connector 10 is inserted into the connector holding section 4, and the operating lever 21 is swung forwardly. As a result, the conduction testing section 2 is moved forwardly until it is engaged with the connector 10.

Next, it is determined whether or not any one of the terminals 18, which have been primarily locked to the connector 10, comes off the latter, and it is confirmed that the conduction of the terminals 18 is acceptable. Under this condition, with the end 20' of the pushing member 20 abutted against the bottom 11b of the spacer 11 on the bottom 5b of the spacer hole 5, the bottom 11b of the spacer 11 is pushed towards the connector 10, so that the spacer 11 is inserted into the spacer inserting hole 12. In this operation, the locking protrusions 13 of the spacer 11 are engaged with the locking sections 15 of the connector 10, respectively, while the terminal locking ends 14 of the protrusions 11' are abutted against the terminals 18. Thus, the latter 18 have been locked (secondarily locked).

Finally, after it is confirmed that the spacer 11 has been completely inserted into the connector 10, the operating lever 21 is swung back to move the conduction testing section 2 backwardly, and the connector 10 is removed from the connector holding section 4.

The spacer 11 may be inserted into the spacer supplying hole 5 after the conduction testing operation has been carried out with the terminals 18 brought into contact with the testing pins 19. In addition, by applying a part feeder or the like to the spacer lead-in hole 6, the spacers can be successively supplied to the spacer supplying hole 5.

If summarized, in the above-described conventional method, "with the spacer temporarily locked to the connector housing, the terminals are inserted into the connector housing, and primarily locked thereto", and then "the operator pushes the spacer until the latter is finally locked to the connector housing; that is, the terminals are secondarily locked thereto", and thereafter "a conduction test is given to the terminals in the connector.

On the other hand, dispensing with the assembling steps that "the operator temporarily lock the spacer to the connector" and "the operator pushes the spacer until the latter is inserted into the connector", the method of the invention simplifies the conventional connector assembling work. Hence, the method of the invention results in a reduction both in manufacture cost and in labor cost (personnel expenses).

As was described above, in the invention, when the connector is engaged with the conduction testing section, with the aid of the pushing device the spacer is moved into the spacer inserting hole from the spacer supplying hole, so that the terminals in the connector are locked. This feature dispenses with the conventional assembling steps that the spacer is temporarily locked to the connector housing, and then it is finally locked thereto. Accordingly, the labor cost and the number of assembling steps are reduced which are required both for preparatory operations in temporarily locking the spacer to the connector housing and for the pushing work in finally locking the spacer thereto. That is, the connector is reduced in manufacturing cost and is improved in assembling efficiency.

What is claimed is:

1. A connector conduction tester, comprising:

a stand frame;

a connector holding section, for holding a connector having terminals, arranged on said stand frame;

a conduction testing section arranged on said stand frame, said conduction testing section having testing pins;

an operation section for moving said conducting testing section towards said connector holding section to abut the testing pins against the terminals in the connector; and a spacer pushing member, wherein said stand frame has a spacer supplying hole located below said connector holding section and in alignment with a spacer inserting hole provided in the connector and wherein said spacer pushing member is used to push a spacer through said spacer supplying hole and into said spacer inserting hole.

2. The connector conduction tester of claim 1, wherein said stand frame also has a spacer lead-in hole which communicates with said spacer supplying hole for introducing said spacer therein and a pushing-member inserting hole which is located below said spacer supplying hole and in communication therewith, said pushing member being insertable therein.

3. The connector conduction tester of claim 2, wherein the spacer lead-in hole is formed in a side wall of said stand frame.

4. A method of locking terminal for a connector conduction test, said method comprising the steps of:

setting a connector in a connector holding section;

moving a conduction testing section to test a conduction of terminals in the connector with testing pins;

supplying a spacer to a spacer supplying hole in a stand frame on which said connector holding section is supported, said spacer supplying hole being aligned with a spacer inserting hole provided in the connector; and pushing the spacer into the spacer inserting hole from the spacer supplying hole.

* * * * *